(12) United States Patent
Perlmutter et al.

(10) Patent No.: US 8,782,497 B2
(45) Date of Patent: *Jul. 15, 2014

(54) EFFICIENT RE-READ OPERATIONS IN ANALOG MEMORY CELL ARRAYS

(75) Inventors: Uri Perlmutter, Holon (IL); Naftali Sommer, Rishon Le-Zion (IL); Ofir Shalvi, Ra'anana (IL)

(73) Assignee: Apple Inc., Cupertino, CA (US)

( * ) Notice: Subject to any disclaimer, the term of this patent is extended or adjusted under 35 U.S.C. 154(b) by 176 days.

This patent is subject to a terminal disclaimer.

(21) Appl. No.: 13/523,421

(22) Filed: Jun. 14, 2012

(65) Prior Publication Data
US 2012/0272122 A1    Oct. 25, 2012

Related U.S. Application Data

(62) Division of application No. 12/323,544, filed on Nov. 26, 2008, now Pat. No. 8,225,181.

(60) Provisional application No. 60/991,245, filed on Nov. 30, 2007, provisional application No. 61/013,027, filed on Dec. 12, 2007, provisional application No. 61/016,566, filed on Dec. 25, 2007.

(51) Int. Cl.
*H03M 13/00* (2006.01)
*G08C 25/02* (2006.01)
*H04L 1/18* (2006.01)

(52) U.S. Cl.
USPC ............................ 714/773; 714/748

(58) Field of Classification Search
USPC .................................. 714/773, 748
See application file for complete search history.

(56) References Cited

U.S. PATENT DOCUMENTS

| 3,668,631 | A | * | 6/1972 | Griffith et al. | 714/774 |
|---|---|---|---|---|---|
| 3,668,632 | A | * | 6/1972 | Oldham, III | 714/775 |
| 4,058,851 | A | * | 11/1977 | Scheuneman | 714/6.2 |
| 4,112,502 | A | * | 9/1978 | Scheuneman | 714/5.1 |
| 4,394,763 | A | * | 7/1983 | Nagano et al. | 714/6.1 |
| 4,413,339 | A | * | 11/1983 | Riggle et al. | 714/765 |
| 4,608,687 | A | * | 8/1986 | Dutton | 714/710 |
| 4,654,847 | A | * | 3/1987 | Dutton | 714/6.1 |
| 5,182,752 | A | * | 1/1993 | DeRoo et al. | 714/758 |
| 5,532,962 | A | * | 7/1996 | Auclair et al. | 365/201 |
| 5,687,114 | A |   | 11/1997 | Khan |  |
| 5,748,533 | A |   | 5/1998 | Dunlap et al. |  |
| 6,023,781 | A |   | 2/2000 | Hazama |  |
| 6,405,342 | B1 | * | 6/2002 | Lee | 714/792 |
| 6,490,236 | B1 | * | 12/2002 | Fukuda et al. | 369/53.35 |
| 6,640,326 | B1 | * | 10/2003 | Buckingham et al. | 714/769 |
| 6,804,805 | B2 | * | 10/2004 | Rub | 714/752 |

(Continued)

*Primary Examiner* — Joseph D Torres
(74) *Attorney, Agent, or Firm* — Meyertons, Hood, Kivlin, Kowert & Goetzel, P.C.

(57) ABSTRACT

A method for data storage includes storing data, which is encoded with an Error Correction Code (ECC), in a group of analog memory cells by writing respective first storage values to the memory cells in the group. After storing the data, respective second storage values are read from the memory cells in the group, and the read second storage values are processed so as to decode the ECC. Responsively to a failure in decoding the ECC, one or more of the second storage values that potentially caused the failure are identified as suspect storage values. Respective third storage values are re-read from a subset of the memory cells that includes the memory cells holding the suspect storage values. The ECC is re-decoded using the third storage values so as to reconstruct the stored data.

24 Claims, 2 Drawing Sheets

(56) References Cited

U.S. PATENT DOCUMENTS

| | | |
|---|---|---|
| 7,023,735 B2 | 4/2006 | Ban et al. |
| 7,196,644 B1 * | 3/2007 | Anderson et al. ............. 341/118 |
| 7,266,069 B2 * | 9/2007 | Chu .......................... 369/53.35 |
| 7,343,330 B1 * | 3/2008 | Boesjes et al. ................. 705/28 |
| 7,365,671 B1 * | 4/2008 | Anderson .................... 341/155 |
| 7,447,970 B2 * | 11/2008 | Wu et al. ...................... 714/751 |
| 7,558,109 B2 * | 7/2009 | Brandman et al. ........ 365/185.03 |
| 7,644,347 B2 * | 1/2010 | Alexander et al. ............ 714/799 |
| 7,661,054 B2 * | 2/2010 | Huffman et al. .............. 714/746 |
| 7,665,007 B2 * | 2/2010 | Yang et al. .................... 714/755 |
| 7,848,149 B2 | 12/2010 | Gonzalez et al. |
| 7,975,192 B2 * | 7/2011 | Sommer et al. ............... 714/719 |
| 8,014,094 B1 * | 9/2011 | Jin ................................. 360/31 |

* cited by examiner

EFFICIENT RE-READ OPERATIONS IN ANALOG MEMORY CELL ARRAYS

CROSS-REFERENCE TO RELATED APPLICATIONS

This invention is a divisional application of U.S. patent application Ser. No. 12/323,544, entitled "Efficient Re-read Operations from Memory Devices", filed Nov. 26, 2008, which claims the benefit of U.S. Provisional Patent Application 60/991,245, filed Nov. 30, 2007, U.S. Provisional Patent Application 61/013,027, filed Dec. 12, 2007, and U.S. Provisional Patent Application 61/016,566, filed Dec. 25, 2007, whose disclosures are incorporated herein by reference.

FIELD OF THE INVENTION

The present invention relates generally to memory devices, and particularly to methods and systems for data retrieval from analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24th International Conference on Microelectronics (MIEL), Nis, Serbia and Montenegro, May 16-19, 2004, volume 1, pages 377-384, which is incorporated herein by reference.

Analog memory cell arrays are typically divided into pages, such that data is written to or read from the memory cells of a given page simultaneously. Some known techniques, however, access memory cells at a finer granularity. For example, U.S. Patent Application Publication 2006/0271748, whose disclosure is incorporated herein by reference, describes systems and methods for memory management. The disclosed methods detect a request to activate a memory portion, which is limited in size to a partial page size, where the partial page size is less than a full page size associated with the memory. In one embodiment, detecting the request includes identifying a row address and partial page address associated with the request, where the partial page address indicates that the memory portion is to be limited to the partial page size.

U.S. Pat. No. 6,101,614, whose disclosure is incorporated herein by reference, describes a method and apparatus for automatically scrubbing Error Correction Code (ECC) errors in memory upon the detection of a correctable error in data read from memory. A memory controller includes memory control logic for controlling accesses to memory, an ECC error checking and correcting unit for checking data read from memory for errors and for correcting any correctable errors found in the read data, a first data buffer for storing the corrected read data output from the ECC error checking and correcting unit, and a write-back path having an input end coupled to an output of the first data buffer and an output end coupled to memory. Upon the detection of a correctable error in data read from a particular memory location, the ECC error checking and correcting unit signals to the memory control logic the existence of a correctable error in the read data. The memory control logic then obtains exclusive control over the first data buffer and the write-back path to control writing of the corrected read data onto the write-back path and subsequently to memory.

Data is often read from analog memory cells by comparing the storage values of the cells to one or more read thresholds. In some known methods, the cells are read using multiple read thresholds. For example, PCT International Publication WO 2008/053472, whose disclosure is incorporated herein by reference, describes a method for operating a memory that includes multiple analog memory cells. The method includes storing data, which is encoded with an ECC, in the analog memory cells by writing respective analog input values selected from a set of nominal values to the cells. The stored data is read by performing multiple read operations that compare analog output values of the analog memory cells to different, respective read thresholds so as to produce multiple comparison results for each of the analog memory cells. Soft metrics are computed responsively to the multiple comparison results. The ECC is decoded using the soft metrics, so as to extract the data stored in the analog memory cells.

SUMMARY OF THE INVENTION

An embodiment of the present invention provides a method for data storage, including:

storing data, which is encoded with an Error Correction Code (ECC), in a group of analog memory cells by writing respective first storage values to the memory cells in the group;

after storing the data, reading respective second storage values from the memory cells in the group, and processing the read second storage values so as to decode the ECC;

responsively to a failure in decoding the ECC, identifying one or more of the second storage values that potentially caused the failure as suspect storage values;

re-reading respective third storage values from a subset of the memory cells that includes the memory cells holding the suspect storage values; and re-decoding the ECC using the third storage values so as to reconstruct the stored data.

In some embodiments, re-reading the third storage values includes refraining from re-reading the third storage values from at least some of the memory cells that do not hold the suspect storage values. In an embodiment, reading the second storage values includes reading the second storage values using one or more first read thresholds, and re-reading the third storage values includes re-reading the third storage values using one or more second read thresholds, different from the respective first read thresholds.

In a disclosed embodiment, storing the data includes programming the memory cells to assume at least first and second programming levels that are mapped to respective first and second storage value regions having a boundary region therebetween, and identifying the suspect storage values includes identifying at least one of the second storage values falling in the boundary region. In another embodiment, identifying the second storage values falling in the boundary region includes comparing the second storage values to first and second read thresholds that are positioned in the boundary region.

In yet another embodiment, re-reading the third storage values includes transferring the third storage values from the memory cells over an interface to a controller, and re-decoding the ECC includes re-decoding the ECC in the controller. Transferring the third storage values may include transferring over the interface only the third storage values re-read from the memory cells in the subset. In an embodiment, re-reading the third storage values includes reading the third storage values from all the memory cells in the group. Alternatively, re-reading the third storage values may include refraining from re-reading the third storage values from the memory cells that are not in the subset.

In some embodiments, re-reading the third storage values includes sending from the controller over the interface an instruction to enter a predefined reading mode, the instruction indicating the group of the memory cells from which the third storage values are to be read when operating in the predefined mode. In an embodiment, when operating in the predefined reading mode, re-reading the third storage values includes sending from the controller read requests specifying respective addresses of the third storage values within the indicated group, and re-reading the third storage values responsively to the read requests. Sending the read requests may include specifying a given address of a given third storage value requested in a given read request by specifying in the given read request an offset of the given address from a previous address of a previous third storage value requested in a previous read request that precedes the given read request.

In a disclosed embodiment, re-decoding the ECC includes computing respective metrics of the third storage values, and decoding the ECC using the metrics. In another embodiment, re-reading the third storage values includes re-reading multiple instances of the third storage values using respective, different read thresholds, and re-decoding the ECC includes decoding the ECC responsively to the multiple instances of the third storage values.

In yet another embodiment, one or more of the suspect storage values are affected by cross-coupling interference, and the method includes identifying one or more potentially-interfering memory cells that potentially cause the cross-coupling interference, reading fourth storage values from the potentially-interfering memory cells, and compensating for the cross-coupling interference responsively to the fourth storage values.

There is additionally provided, in accordance with an embodiment of the present invention, apparatus for data storage, including:

a memory, which includes a plurality of analog memory cells; and circuitry, which is coupled to store data that is encoded with an Error Correction Code (ECC) in a group of the memory cells by writing respective first storage values to the memory cells in the group, to read, after storing the data, respective second storage values from the memory cells in the group, to process the read second storage values so as to decode the ECC, to identify, responsively to a failure in decoding the ECC, one or more of the second storage values that potentially caused the failure as suspect storage values, to re-read respective third storage values from a subset of the memory cells that includes the memory cells holding the suspect storage values, and to re-decode the ECC using the third storage values.

In some embodiments, the circuitry includes:

a Read/Write (R/W) unit, which is packaged in a memory device including the memory cells and which is coupled to re-read the third storage values and to export the third storage values from the memory device over an interface; and a memory controller, which is external to the memory device and is coupled to receive the third storage values over the interface and to re-decode the ECC using the received third storage values.

The present invention will be more fully understood from the following detailed description of the embodiments thereof, taken together with the drawings in which:

DETAILED DESCRIPTION OF EMBODIMENTS

Overview

Figure 1:
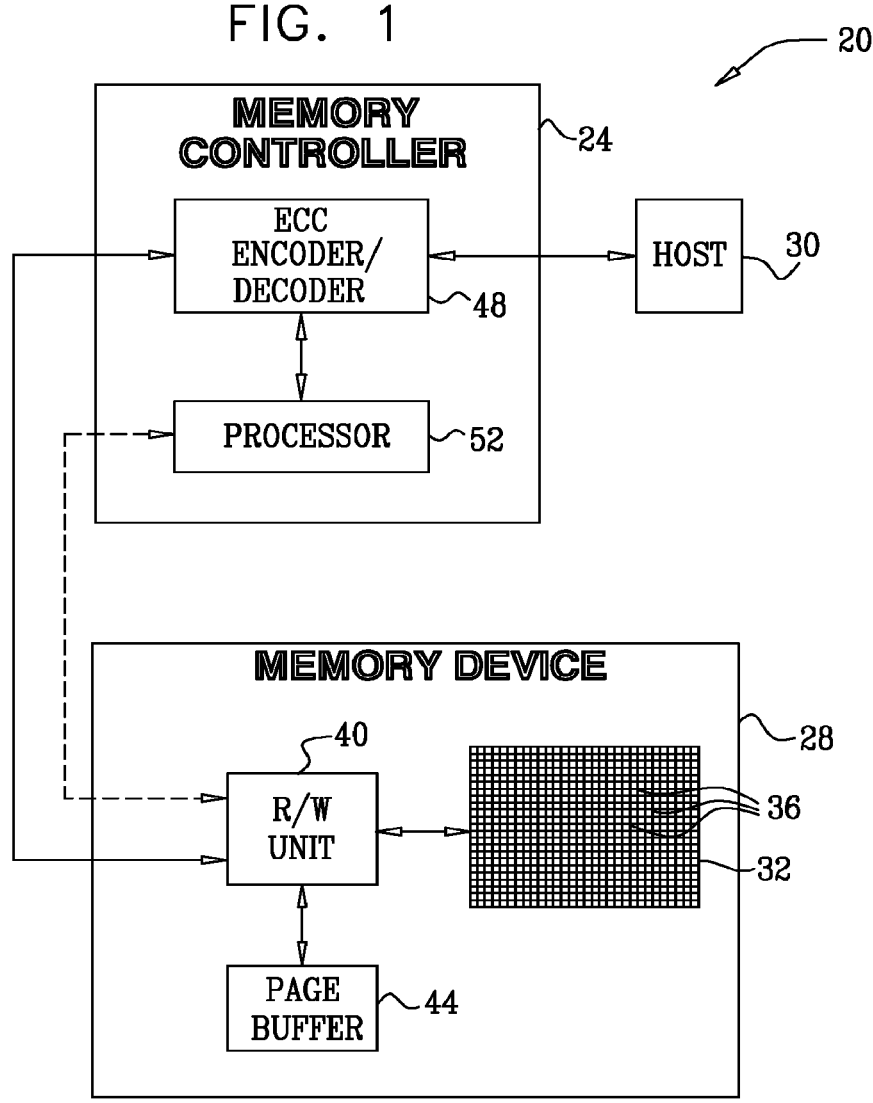
FIG. 1 is a block diagram that schematically illustrates a memory system, in accordance with an embodiment of the present invention.

In some data retrieval schemes, data is retrieved from a group of memory cells by re-reading the cells multiple times using different read thresholds. Typically, the stored data is encoded with an Error Correction Code (ECC), and ECC decoding is applied jointly to the results of the multiple read operations. For example, soft metrics can be computed for the respective storage values based on the multiple read results, and the ECC can be decoded using the soft metrics. Such multi-threshold techniques are powerful in reducing the likelihood of read errors, for example when the cells are subject to strong cross-coupling interference or other impairments.

On the other hand, re-reading the cells multiple times multiplies the number of operations performed by the reading circuitry, as well as the volume of information that is transferred out of the memory cells. This increase in information volume may limit the achievable data retrieval speed. The effect on data retrieval speed is especially severe when the memory cells reside in one device, the ECC decoding process is performed in another device, and the read results are transferred between the devices over a limited-bandwidth interface.

Embodiments of the present invention that are described hereinbelow provide improved methods and systems for retrieving data from groups of analog memory cells using multiple read operations. In some embodiments, a memory system comprises a memory controller that stores data in a memory device. The memory device comprises an array of analog memory cells and a Read/Write (R/W) unit, which stores data in the memory cells by writing respective storage values (e.g., threshold voltages) to the cells. The memory controller comprises an ECC encoder that encodes the data for storage, and an ECC decoder that decodes the ECC of data retrieved from memory.

When data is to be retrieved from a group of memory cells, the system initially reads the storage values from the cells using a certain read threshold, and attempts to decode the ECC. If ECC decoding fails, the system identifies one or more of the initially-read storage values as suspect storage values that are suspected of having potentially caused the failure. For example, the system may identify storage values that fall in a boundary region between adjacent programming levels, and treat these storage values as suspect storage values. The system re-reads the suspect storage values using different read thresholds, and transfers the re-read results of the suspect values to the ECC decoder. The ECC decoder re-attempts to decode the ECC using the re-read suspect storage values. For example, the system may compute respective hard or soft metrics for the suspect storage values based on the re-read results.

The disclosed methods and systems refrain from transferring a complete set of read results from the memory device to the memory controller. Instead, the disclosed methods and systems focus on identifying, re-reading and transferring the suspect storage values, which affect the quality of the ECC decoding process. In most practical cases, the number of suspect storage values, which may have contributed to the ECC decoding failure, is only a fraction of the overall number of storage values. The vast majority of storage values lie well within their designated storage value regions, and therefore re-reading them is of little or no value to the decoding process.

Thus, the methods and systems described herein considerably reduce the volume of information that is generated and transferred from the memory device, in comparison with known multi-threshold reading schemes. As a result, higher data retrieval speeds can be achieved. Moreover, when using the disclosed techniques, memory devices can be connected to memory controllers with lower-throughput interfaces without compromising performance.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory controller 24, which stores data in a memory device 28 comprising a memory cell array 32. The memory cell array comprises multiple analog memory cells 36, in which the data is stored. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and CTF Flash cells, PCM, NROM, FRAM, MRAM and DRAM cells. Memory cells 36 may comprise Single-Level Cells (SLC) or Multi-Level Cells (MLC, also referred to as multi-bit cells).

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values to the cell.

Memory device 28 comprises a reading/writing (R/W) unit 40, which converts data for storage in the memory device to storage values and writes them into memory cells 36. In alternative embodiments, the R/W unit does not perform the conversion, but is provided with voltage samples, i.e., with the storage values for storage in the cells. The R/W unit typically (although not necessarily) programs the cells using an iterative Program and Verify (P&V) process, as is known in the art. When reading data out of array 32, R/W unit 40 converts the storage values of memory cells 36 into digital samples having a resolution of one or more bits. Data is typically written to and read from the memory cells in groups that are referred to as pages. Memory device 28 comprises one or more page buffers 44, in which the R/W unit caches data intended for storage and/or data that has been read from array 32.

Memory controller 24 encodes the data with an Error Correction Code (ECC) before sending the data to device 28 for storage, and decodes the ECC when retrieving data from device 28. Controller 24 comprises an ECC encoder/decoder 48 for this purpose. Encoder/decoder 48 may apply any suitable type of ECC. The description that follows sometimes refers separately to an ECC encoder and/or to an ECC decoder, regardless of whether the encoder and decoder are implemented in a single unit or in separate units.

The memory controller further comprises a processor 52, which controls the storage and retrieval of data in device 28. In particular, processor 52 controls ECC encoder/decoder 48 and R/W unit 40. Memory controller 24 communicates with a host 30, for accepting data for storage in the memory device and for outputting data retrieved from the memory device. The different elements of controller 24 may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 28 and memory controller are implemented as two separate Integrated Circuits (ICs). In alternative embodiments, however, the memory device and the memory controller may be integrated on separate semiconductor dies in a single Multi-Chip Package (MCP) or System on Chip (SoC). Further alternatively, some or all of the memory controller's circuitry may reside on the same die on which the memory array is disposed. Further alternatively, some or all of the functionality of the memory controller can be implemented in software and carried out by a processor or other element of the host system. In some implementations, a single memory controller may be connected to multiple memory devices 28. In yet another embodiment, some or all of the memory controller's functionality may be carried out by a separate unit, referred to as a memory extension, which acts as a slave of memory device 28.

Typically, processor 52 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

Memory cells 36 of array 32 are typically arranged in a grid having multiple rows and columns, commonly referred to as word lines and bit lines, respectively. The array is typically divided into multiple pages, i.e., groups of memory cells that are programmed and read simultaneously. Cells are typically erased in groups of word lines that are referred to as erasure blocks.

Data Retrieval Using Re-Read Operations

The storage values (e.g., threshold voltages) stored in analog memory cells often deviate from their nominal target values because of cell-to-cell variations, tolerances and inaccuracies in the programming process, or for various other reasons. The storage values of the cells associated with a given programming level are typically distributed in accordance with a certain statistical distribution. Typically, the stored data is retrieved from the cells by comparing the storage values of the cells to one or more read thresholds. The read thresholds are usually positioned in the boundary regions between adjacent distributions, so that comparing the storage values to the read thresholds is likely to differentiate between storage values belonging to different programming levels.

Figure 2:
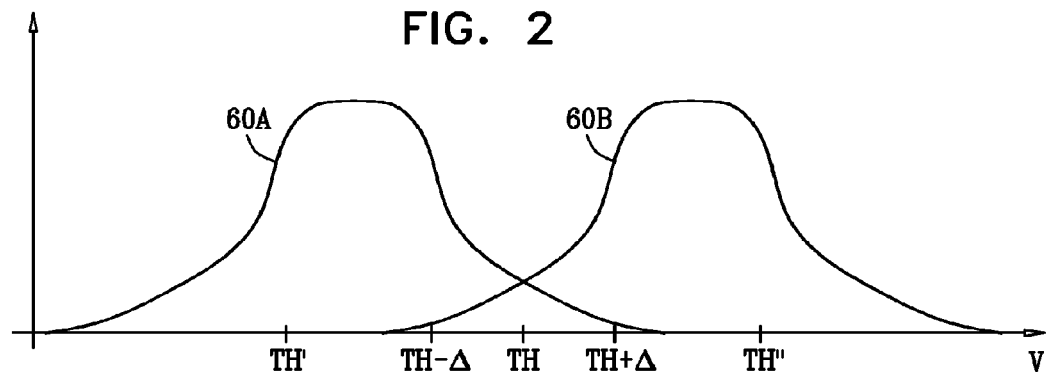
FIG. 2 is a graph showing threshold voltage distributions in a group of analog memory cells, in accordance with an embodiment of the present invention.

FIG. 2 is a graph showing example threshold voltage distributions in a group of analog memory cells 36, in accordance with an embodiment of the present invention. In the present example, cells 36 comprise Single-Level Cells (SLC), each storing a single data bit. A plot 60A shows the threshold voltage distribution of the cells associated with one of the programming levels. A plot 60B shows the threshold voltage distribution of the cells associated with the other programming level. The two programming levels correspond to stored bit values of "0" and "1".

In some embodiments, the memory controller or the R/W unit retrieves data from a group of memory cells 36 by performing multiple read operations using different read thresholds. The results of the multiple read operations are combined, so as to reconstruct the data stored in the cells. Data retrieval using multiple read thresholds is advantageous, for example, for reducing the likelihood of read errors, particularly when the adjacent distributions are not well differentiated, e.g., in close proximity to one another or even overlapping. In FIG. 2, for example, distributions 60A and 60B overlap.

Thus, in some cases, storage values falling in the overlap region may fall on the wrong side of the read threshold and may cause read errors. In this sort of situation, reading a given cell multiple times using multiple different read thresholds (which are typically positioned in the overlap region) provides additional information regarding the storage value of the cell, and may help to reduce the probability of a read error. Multiple re-read operations are also beneficial in other situations, such as when the storage values of the cells are subject to cross-coupling interference from other memory cells or other kinds of distortion.

The multiple read results of a given cell can be combined in various ways in order to reconstruct the data stored in the cell. For example, the data can be decoded using a Look-Up Table (LUT) or other function that maps combinations of read results to data values. Additionally or alternatively, the memory controller may compute a hard or soft decoding metric associated with a given cell based on the multiple read results obtained from the cells. The metric typically indicates the confidence level associated with the values read from the cell, and can later be used in decoding the ECC. Techniques for data retrieval using multiple different read thresholds is addressed, for example, in PCT International Publication WO 2008/053472, cited above, and in PCT International Publication WO 2007/132457, whose disclosure is incorporated herein by reference.

Multiple Read Operations by Re-Reading Only a Subset of the Memory Cells

On one hand, reading memory cells multiple times using different thresholds reduces the likelihood of read errors. On the other hand, the multiple read operations may considerably increase the computational and communication load in the memory system, and may affect the data retrieval speed. Consider, for example, the configuration of FIG. 1, in which reading the cells is performed in one device (memory device 28) and ECC decoding is performed in another device (memory controller 24). In such a configuration, the read results are transferred over the interface between device 28 and controller 24. Transferring multiple re-read results from the memory device to the controller increases the communication load over this interface considerably.

Embodiments of the present invention that are described herein provide improved methods and systems for retrieving data from groups of analog memory cells using multiple read operations. In accordance with the disclosed methods and systems, the ECC decoder initially attempts to decode the ECC based on a set of read storage values. If ECC decoding fails, the memory controller or the memory device identifies one or more of the read storage values, which are suspected of causing the failure. The storage values of the suspect cells are re-read with different thresholds, and the re-read results are provided to the ECC decoder. ECC decoding is re-attempted using the multiple re-read storage values.

In some embodiments, the re-read operations are performed selectively on the cells whose storage values are suspected of causing the ECC decoding failure. In alternative embodiments, the entire group of cells is re-read, but the re-read results of the suspect cells are transferred selectively to the ECC decoder.

Since ECC decoding failures are usually caused by a relatively small number of storage values, only few re-read results are typically transferred to the ECC decoder. Therefore, the communication volume over the interface between the memory device and the memory controller (or, more generally, over any interface between the R/W unit and the ECC decoder) is reduced considerably, in comparison with schemes in which the re-read results are transferred non-selectively.

Identifying Storage Values Suspected of Causing Decoding Failure

The memory controller or the memory device may use various techniques for identifying the subset of storage values that are suspected of causing the ECC decoding failure. In the description that follows, the suspect storage values are identified by the memory controller. Generally, however, this function can be performed by circuitry that resides either in the memory controller and/or in the memory device (e.g., as part of R/W unit 40). The identification function may be implemented in software, in hardware or using a combination of both hardware and software elements.

In some embodiments, the memory controller identifies storage values that fall in a certain boundary region between adjacent programming level distributions, and regards these storage values as suspected of causing the failure. Consider, for example, the SLC scheme of FIG. 2. Initially, the cells are read with the read threshold denoted TH in the figure. Since distributions 60A and 60B have a significant overlap between them, some of the read storage values may fall on the wrong side of threshold TH, which may cause an ECC decoding failure.

The memory controller may identify the storage values suspected of causing this failure by performing two additional read operations, using two read thresholds denoted TH−Δ and TH+Δ in the figure. Typically, a high-confidence cell is expected to have the same read results is all three read operations (i.e., the storage value is expected to be either higher or lower than all three read thresholds TH, TH−Δ and TH+Δ). On the other hand, cells whose read results differ among the three read operations are regarded by the memory controller as having a high level of distortion and thus of low confidence.

In alternative embodiments, the cells may be re-read with any number of read thresholds at any suitable positions in order to identify low-confidence storage values falling in the boundary region between programming level distributions. Further alternatively, the memory controller may use any other method and criterion for identifying a subset of the storage values that are suspected of causing the ECC decoding failure.

Selective Re-Reading Based on Identified Suspect Storage Values

Having identified the suspect storage values, the memory controller re-reads these storage values using different read thresholds, and the ECC decoder re-attempts to decode the ECC using the re-read results. In the present example, the cells holding the suspect storage values are re-read twice more, using read thresholds denoted TH' and TH" in the figure. Alternatively, the cells holding the suspect storage values can be re-read using any suitable number of read thresholds at any suitable positions.

In some embodiments, the memory controller instructs R/W unit 40 to re-read only a specified subset of the cells, which hold the suspect storage values. For example, some Flash devices support partial read commands, which enable the device to read only a specified part of a given page rather than the entire page. In these embodiments, the memory controller instructs the R/W unit to re-read the appropriate subset of cells, and the memory device transfers the results of the partial read operations to the memory controller.

In these embodiments, both the reading time (i.e., the length of time during which the cells are read) and the transfer time (i.e., the length of time during which the re-read results are transferred to the memory controller) are reduced. Re-reading only a subset of the cells in a given page sometimes involves sensing only a subset of the bit lines, which contain the re-read cells. Such partial sensing may reduce the power consumption of the read operation, as well as the reading time.

In alternative embodiments, the entire group of cells is read, but only part of the re-read results (comprising the re-read results of the suspect cells) are transferred to the memory controller. In these embodiments, the transfer time is reduced but the reading time typically remains unchanged. In many practical cases, however, the transfer time is dominant in determining the overall data retrieval speed. For example, in some Flash devices, the reading time of an entire 4 Kbyte page is on the order of 25-50 μS, while the transfer time of an entire page is on the order of 100 μS. As can be appreciated, reducing the transfer time to a fraction of its size has a considerable effect on the overall data retrieval time.

In some implementations of memory device 28, an entire page is read into page buffer 44. Then, the memory controller may request a partial sequence of bytes from a desired location in the buffer. Each of the read storage values, including the suspect storage values, is represented using one or more bit values. This mode of operation introduces some inefficiency in comparison with transferring of entire pages. In particular, if the bits that represent the suspect storage values are distributed across a large number of non-consecutive bytes in the buffer, a large number of read requests may be needed.

In a typical conventional interface, each partial read request uses approximately five byte cycles on the interface between the memory device and the controller (one cycle for a start command, two cycles for indicating the requested location within the page, one cycle for reading the data byte, and one cycle for an end command). When an entire page is transferred, on the other hand, only a single byte cycle is used. However, since the number of bits representing suspect values is usually small with respect to the size of the page (e.g., <3%), partial transfer is more efficient that full page transfer even given this inefficiency. For example, if 1% of a 32 Kbit page represent values that are suspected of causing the ECC failure, 320 bytes will be transferred. This partial transfer uses 1600 byte cycles. Full transfer of the entire page, on the other hand, would use 4000 cycles.

It should be noted that even when the memory device supports partial read commands, re-reading the storage values suspected of causing the ECC failure may involve reading some non-suspected values, as well. For example, when the partial read command has a certain granularity (e.g., byte or word), reading a suspected storage value may cause the device to read one or more non-suspected storage values that fall in the same byte or word.

The partial read functionality can be implemented using software, hardware or a combination of both. For example, dedicated hardware circuitry may accept a list of suspected bits (i.e., bits representing suspect storage values), and perform one or more partial read operations from the appropriate cells. Additionally or alternatively, the ECC decoding process (or other signal processing functions) may be designed to operate differentially on parts of pages, rather than on entire pages. For example, the ECC decoding process may be designed to update the decoding result of a given page in response to a change in a subset of the bit values of the page. Such an ECC process is highly efficient in operating with the methods described herein.

In an alternative embodiment, the memory device may be designed to enhance the performance of the partial read operation. For example, the memory device may accept from the controller a sequence of bits that correspond to the bits of a given page. Each bit in the sequence indicates whether the respective bit in the page is suspect (i.e., represents a suspect storage value) or not. In subsequent re-read operations, the memory device will transfer read results of a given bit to the controller only if this bit is marked as suspect. Alternatively, the controller may indicate the identities of suspect bits to the memory device using any other suitable means.

Data Retrieval Method Description

Figure 3:
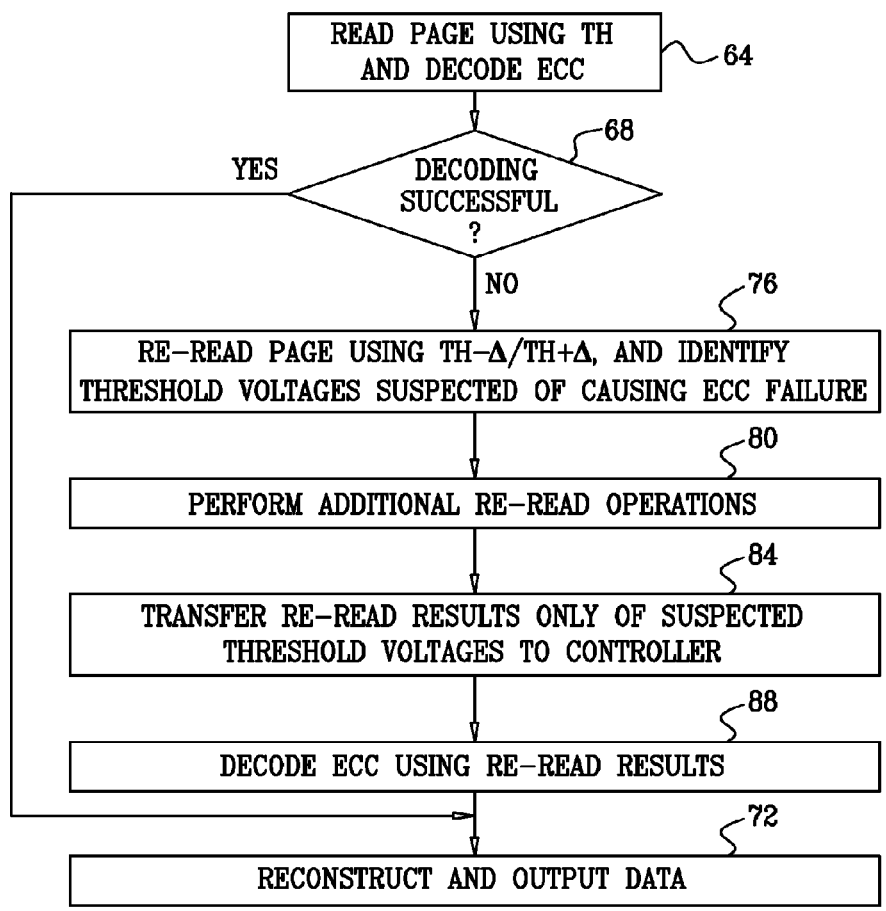
FIG. 3 is a flow chart that schematically illustrates a method for retrieving data from a group of analog memory cells, in accordance with an embodiment of the present invention.

FIG. 3 is a flow chart that schematically illustrates a method for retrieving data from a group of analog memory cells, in accordance with an embodiment of the present invention. The description that follows refers to the example SLC configuration shown in FIGS. 1 and 2. The method begins with system 20 reading a given page, at an initial reading step 64. R/W unit 40 reads the page using read threshold TH, and the ECC decoder in memory controller 24 attempts to decode the ECC.

The ECC decoder checks whether decoding was successful, at a checking step 68. If successful, the memory controller reconstructs and outputs the page data, at a reconstruction step 72. If, on the other hand, ECC decoding has failed, system 20 identifies one or more suspect storage values, which are suspected of having caused the failure, at a suspect identification step 76. In some embodiments, system 20 re-reads the page twice using two respective read thresholds denoted TH−Δ and TH+Δ, in order to identify low-confidence storage values that fall in the boundary region between programming levels.

System 20 re-reads the cells holding the suspect storage values using different read thresholds, at a re-reading step 80. The memory device transfers the re-read results to the memory controller, at a transfer step 84. Since the number of suspect storage values is typically much smaller than the total number of storage values, the overhead of transferring the re-read results to the controller is relatively small in comparison with full-page transfer schemes.

The ECC decoder re-attempts to decode the ECC based on the re-read results of the suspect storage values, which were transferred from the memory device, at a re-decoding step 88. The ECC decoder may use the re-read results of the suspect values in various ways. Typically, the ECC decoder combines the re-read results with the respective initial read results of the cells, which were read at step 64 above. For example, processor 52 of the memory controller may compute hard or soft metrics associated respectively with the suspect storage values, based on the initial read results and on the re-read results. The ECC decoder can then decode the ECC using the metrics. Alternatively, the memory controller may apply any of the techniques described in PCT International Publications WO 2008/053472 and WO 2007/132457, cited above. Assuming the re-decoding operation is successful, the memory controller reconstructs and outputs the page data, at output step 72.

Efficient Requesting of Re-Read Results

In some embodiments of the present invention, R/W unit 40 and memory controller 24 may apply various techniques to further reduce the amount of data and/or control information that is transferred between the memory device and the memory controller. The description that follows provides several examples of techniques that can be used for this purpose. Such techniques can be used, for example, as part of transfer step 84 of the method of FIG. 3 above.

A conventional partial read request typically comprises a start command, which specifies the block and page from which a requested data byte is to be read. The start command is followed by an indication of the requested location within the page, an additional cycle for reading the requested byte, and an end command. Transferring re-read results to the memory controller, however, typically involves reading and transferring multiple bytes from the same page. In such a case, specifying the block and page number separately for each requested byte adds an unnecessary overhead.

In some embodiments, the partial read operation can be designed to consume a small number of bus cycles. For example, the memory device can be instructed by the memory controller to enter a dedicated partial read mode. When entering this mode, the memory controller notifies the memory device of the block and page number from which subsequent byte requests are to be read. After entering the dedicated mode, the memory controller sends byte read requests that specify only two address bytes indicating the requested byte location within the page, and then reads the resulting data byte. The start and end commands are omitted, since the block and page numbers are already known to the memory device. In comparison with conventional schemes that send the page and byte address for each requested byte, the number of cycles per byte read operation is reduced by two. In alternative embodiments, the memory controller does not necessarily read each byte immediately after it is requested. For example, the memory controller may send a sequence of requested byte indices, and then read the multiple requested bytes.

When all the requested bytes of a given page have been read, the memory controller instructs the memory device to exit the dedicated mode, such as by sending an illegal byte address that falls outside the valid address range. The memory device interprets illegal byte addresses as an instruction to exit the dedicated read mode. Alternatively, the memory controller and memory device may use any other suitable mechanism for coordinating the transitions into and out of the dedicated read mode.

The partial read requests can be further compressed by specifying the requested byte addresses in a differential manner. In these embodiments, the memory controller requests a certain byte (except the first one) by indicating the offset from the address of the previously-requested byte. Assuming that most of the requested bytes will have an offset from the previously-read byte that is smaller than 255 bytes, one byte per read request can be saved. The memory controller can instruct the memory device to exit such a mode by requesting a byte offset of zero.

Generally, the memory controller may issue partial read requests that specify the addresses of the requested data, not necessarily in bytes. For example, the memory controller may specify indices of individual bits or memory cells rather than of bytes. In some embodiments, the memory device refrains from sensing the cells containing the bytes or bits that were not requested, and thus reduces power consumption, cell wearing and reading time.

Additional Use Cases

As noted above, after a failure to decode the ECC in a page that was read using a read threshold TH, the memory controller may identify the storage values that are suspected of causing the failure by re-reading the page using read thresholds that are set to TH$-\Delta$ and TH$+\Delta$. In these embodiments, storage values that fall in the interval [TH$-\Delta$, TH$+\Delta$] are regarded as suspects and are handled in various ways that are described above.

In some cases, however, the additional resolution provided by re-reading the page using TH$-\Delta$ and TH$+\Delta$ is still insufficient for successfully decoding the ECC, and additional resolution refinement is desired. In these cases (e.g., upon another failure to decode the ECC after re-reading the page using thresholds set to TH$-\Delta$ and TH$+\Delta$) the memory controller may perform additional re-read operations, using additional read threshold values, in order to refine the soft information that is available regarding the suspect storage values.

In some embodiments of the present invention, the memory controller may perform these additional re-read operations on only a small subset of the cells in the page. As a result, considerable throughput, reading time and/or power consumption saving can be achieved. For example, assume a situation in which the additional read thresholds used for refinement are positioned within the interval [TH$-\Delta$, TH$+\Delta$] (e.g., when re-reading the cells again using read thresholds set to TH$-\Delta/2$ and TH$+\Delta/2$). In such a case, the memory controller may perform the additional re-read operations on only the cells whose storage values were previously identified as falling between TH$-\Delta$ and TH$+\Delta$, and not on the entire page. As can be appreciated, re-reading cells whose storage values are already known to be outside a given interval using thresholds that are positioned within this interval will typically add no information.

In some cases, one or more of the suspect storage values deviate from the nominal storage values of their respective programming levels because of cross-coupling interference from other memory cells. In other words, a given storage value, which is suspected of having caused an ECC failure, may have become a suspect because it is shifted due to cross-coupling interference from other cells.

In some embodiments, the memory controller compensates for cross-coupling interference in a given cell based on the storage values of one or more cells that potentially cause the cross-coupling interference. The potentially-interfering cells often (although not necessarily) comprise neighbors of the interfered cell. In order to compensate for the cross-coupling interference, the memory controller reads at least some of the potentially-interfering cells. The potentially-interfering cells of a given interfered cell may belong to the same page as the interfered cell, or in other (often neighboring) pages. Techniques for canceling cross-coupling interference are described, for example, in PCT International Publication WO 2007/132457, cited above, and in PCT International Publication WO 2007/132453, whose disclosure is incorporated herein by reference.

When using the selective re-reading techniques described herein, the memory controller can obtain the storage values of the potentially-interfering cells by reading only a relatively small subset of the cells. In some embodiments, the memory controller applies cross-coupling cancellation by (1) identifying the subset of storage values that are suspected of causing the ECC failure, (2) reading the storage values from only the cells that potentially cause cross-coupling interference to the suspect cells, and (3) apply cross-coupling cancellation based on the storage values read from the potentially-interfering cells.

Identifying the cells that potentially cause cross-coupling interference to a given cell may be based on any suitable criterion. For example, in some cases the dominant cross-coupling interference is caused by the cell's two immediate vertical neighbors (i.e., the cells positioned on the same bit line as the interfered cell and on neighboring word lines). In these cases, the memory controller may selectively read the vertical neighbors of the suspect cells, and apply interference cancellation based on these read values.

The embodiments described herein refer mainly to memory pages. The methods and systems described herein may be used, however, with any other suitable groups of memory cells, such as sectors within pages.

Although the embodiments described herein mainly address SLC configurations, this choice was made purely for the sake of conceptual clarity. The methods and systems described herein can similarly be used in MLC devices having three or more programming levels. For example, the memory device or memory controller may identify storage values falling in boundary regions between adjacent programming level distributions, and mark these values as suspects.

Although the embodiments described herein mainly address retrieving data from solid-state memory devices, the principles of the present invention can also be used for storing and retrieving data in Hard Disk Drives (HDD) and other data storage media and devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
storing data, which is encoded with an Error Correction Code (ECC), in a group of analog memory cells by writing respective first storage values to the memory cells in the group;
after storing the data, reading respective second storage values from the memory cells in the group, and processing the read second storage values so as to decode the ECC;
responsively to a failure in decoding the ECC, identifying one or more of the second storage values that potentially caused the failure as suspect storage values;
re-reading respective third storage values from only a subset of the memory cells in the group, including the memory cells holding the suspect storage values, wherein the number of memory cells in the subset of memory cells in the group is less than the number of memory cells in the group;

computing respective soft decoding metrics of the third storage values; and re-decoding the ECC in a soft ECC decoding process using the third storage values and the respective soft decoding metrics, so as to reconstruct the stored data.

2. The method according to claim 1, wherein reading the second storage values comprises reading the second storage values using one or more first read thresholds, and wherein re-reading the third storage values comprises re-reading the third storage values using one or more second read thresholds, different from the respective first read thresholds.

3. The method according to claim 1, wherein storing the data comprises programming the memory cells to assume at least first and second programming levels that are mapped to respective first and second storage value regions having a boundary region therebetween, and wherein identifying the suspect storage values comprises identifying at least one of the second storage values falling in the boundary region.

4. The method according to claim 1, wherein identifying the second storage values falling in the boundary region comprises comparing the second storage values to first and second read thresholds that are positioned in the boundary region.

5. The method according to claim 1, wherein re-reading the third storage values comprises transferring the third storage values from the memory cells over an interface to a controller, and wherein re-decoding the ECC comprises re-decoding the ECC in the controller.

6. The method according to claim 5, wherein transferring the third storage values comprises transferring over the interface only the third storage values re-read from the memory cells in the subset.

7. The method according to claim 6, wherein re-reading the third storage values comprises reading the third storage values from all the memory cells in the group.

8. The method according to claim 5, wherein re-reading the third storage values comprises sending from the controller over the interface an instruction to enter a predefined reading mode, the instruction indicating the subset of the memory cells from which the third storage values are to be read when operating in the predefined mode.

9. The method according to claim 8, wherein, when operating in the predefined reading mode, re-reading the third storage values comprises sending from the controller read requests specifying respective addresses of the third storage values within the indicated group, and re-reading the third storage values responsively to the read requests.

10. The method according to claim 9, wherein sending the read requests comprises specifying a given address of a given third storage value requested in a given read request by specifying in the given read request an offset of the given address from a previous address of a previous third storage value requested in a previous read request that precedes the given read request.

11. The method according to claim 1, wherein re-reading the third storage values comprises re-reading multiple instances of the third storage values using respective, different read thresholds, and wherein computing the soft decoding metrics comprises calculating the metrics based on the multiple instances of the third storage values.

12. The method according to claim 1, wherein one or more of the suspect storage values are affected by cross-coupling interference, and comprising identifying one or more potentially-interfering memory cells that potentially cause the cross-coupling interference, reading fourth storage values from the potentially-interfering memory cells, and compensating for the cross-coupling interference responsively to the fourth storage values.

13. Apparatus for data storage, comprising:

a memory, which comprises a plurality of analog memory cells; and circuitry, which is coupled to store data that is encoded with an Error Correction Code (ECC) in a group of the memory cells by writing respective first storage values to the memory cells in the group, to read, after storing the data, respective second storage values from the memory cells in the group, to process the read second storage values so as to decode the ECC, to identify, responsively to a failure in decoding the ECC, one or more of the second storage values that potentially caused the failure as suspect storage values, to re-read respective third storage values from only a subset of the memory cells in the group, including the memory cells holding the suspect storage values, to compute respective soft decoding metrics of the third storage values, and to re-decode the ECC in a soft ECC decoding process using the third storage values and the respective soft decoding metrics, wherein the number of memory cells in the subset of memory cells in the group is less than the number of memory cells in the group.

14. The apparatus according to claim 13, wherein the circuitry is coupled to read the second storage values using one or more first read thresholds, and to re-read the third storage values using one or more second read thresholds, different from the respective first read thresholds.

15. The apparatus according to claim 13, wherein the circuitry is coupled to store the data by programming the memory cells to assume at least first and second programming levels that are mapped to respective first and second storage value regions having a boundary region therebetween, and to identify at least one of the second storage values falling in the boundary region as the suspect storage values.

16. The apparatus according to claim 13, wherein the circuitry is coupled to identify the second storage values falling in the boundary region by comparing the second storage values to first and second read thresholds that are positioned in the boundary region.

17. The apparatus according to claim 13, wherein the circuitry comprises:

a Read/Write (R/W) unit, which is packaged in a memory device comprising the memory cells and which is coupled to re-read the third storage values and to export the third storage values from the memory device over an interface; and a memory controller, which is external to the memory device and is coupled to receive the third storage values over the interface and to re-decode the ECC using the received third storage values.

18. The apparatus according to claim 17, wherein the R/W unit is coupled to transfer over the interface only the third storage values re-read from the memory cells in the subset.

19. The apparatus according to claim 18, wherein the R/W unit is coupled to re-read the third storage values from all the memory cells in the group.

20. The apparatus according to claim 17, wherein the memory controller is coupled to send to the R/W unit an instruction to enter a predefined reading mode, the instruction indicating the subset of the memory cells from which the third storage values are to be read when operating in the predefined mode.

21. The apparatus according to claim 20, wherein, when operating in the predefined reading mode, the memory controller is coupled to send to the R/W unit read requests specifying respective addresses of the third storage values within the indicated group, and wherein the R/W unit is coupled to re-read and export the third storage values responsively to the read requests.

22. The apparatus according to claim 21, wherein the memory controller is coupled to specify a given address of a given third storage value requested in a given read request by specifying in the given read request an offset of the given address from a previous address of a previous third storage value requested in a previous read request that precedes the given read request.

23. The apparatus according to claim 13, wherein the circuitry is coupled to re-read multiple instances of the third storage values using respective, different read thresholds, and to compute the soft decoding metrics responsively to the multiple instances of the third storage values.

24. The apparatus according to claim 13, wherein one or more of the suspect storage values are affected by cross-coupling interference, and wherein the circuitry is coupled to identify one or more potentially-interfering memory cells that potentially cause the cross-coupling interference, to read fourth storage values from the potentially-interfering memory cells, and to compensate for the cross-coupling interference responsively to the fourth storage values.

* * * * *